(12) United States Patent
Lin

(10) Patent No.: US 7,890,281 B2
(45) Date of Patent: Feb. 15, 2011

(54) CONTROLLING METHOD OF CALIBRATING THE AIR-CORE POINTER ASSEMBLY AND DEVICE THEREOF

(76) Inventor: Ling-Jue Lin, 492 Altamont Dr., Milpitas, CA (US) 95035

( * ) Notice: Subject to any disclaimer, the term of this patent is extended or adjusted under 35 U.S.C. 154(b) by 372 days.

(21) Appl. No.: 12/101,954

(22) Filed: Apr. 11, 2008

(65) Prior Publication Data

US 2009/0256549 A1    Oct. 15, 2009

(51) Int. Cl.
*G01P 21/00*    (2006.01)
(52) U.S. Cl. ......................................................... 702/90
(58) Field of Classification Search .................... 702/90
See application file for complete search history.

(56) References Cited

U.S. PATENT DOCUMENTS 4,492,920 A * 1/1985 Reenstra ..................... 324/146
5,986,445 A * 11/1999 Ogawa et al. ............... 324/146
2009/0256549 A1 * 10/2009 Lin ............................. 324/130

* cited by examiner

*Primary Examiner*—Aditya Bhat
(74) *Attorney, Agent, or Firm*—Hershkovitz & Associates, LLC; Abraham Hershkovitz

(57) ABSTRACT

A controlling method and a device are disclosed to calibrate a pointer assembly of an air-core meter. The pointer assembly of the instrument includes a calibrating magnet, a cosine coil, a sine coil and a pointer. According to the polarity of the return-to-zero magnetic field established by the calibrating magnet, a compensating voltage is imposed on the cosine coil or the sine coil or both under either a voltage driving mode or a current driving mode. The compensating voltage establishes a compensating magnetic field to cancel the return-to-zero magnetic field. Therefore, without modifying the structure of the pointer set, the pointer has good linearity and is not affected by the calibrating magnet.

18 Claims, 14 Drawing Sheets

CONTROLLING METHOD OF CALIBRATING THE AIR-CORE POINTER ASSEMBLY AND DEVICE THEREOF

BACKGROUND OF THE INVENTION

1. Field of the Invention

The invention relates to a controlling method of calibrating an air-core pointer assembly of an electric meter and the device thereof. In particular, using an external compensating voltage, the deviating angle of the pointer and an imposed voltage for the pointer keep a good linear relation.

2. Description of Related Art

With reference to FIG. 9, an air-core pointer assembly of a conventional electric meter has a rotor 51 with a permanent magnet, a pointer 52 on the rotor 51 and two coils 53, 54. The two coils 53, 54 are wound orthogonally with respect to each other. To distinguish them, the two coils are called the cosine coil 53 and the sine coil 54, respectively. Once a voltage is applied to the two coils 53, 54, they interact with the permanent magnet on the rotor 51 to deflect the pointer 52. On the other hand, when the voltage is removed, the pointer 52 still stays at where it was. The pointer 52 does not return back to its zero point.

With reference to FIGS. 10 and 11, a first conventional driving circuit for the air-core pointer assembly is shown. Both of the coils 53, 54 receive a common central voltage Vdd, which is 5 volts. The two coils 53, 54 also receives corresponding first and second input voltages V1, V2 through a driver 55a, 56a, respectively. The phases in the two input voltages V1, V2 differ by 90 degrees. Taking the central voltage 5 V as the reference point, the peak value has an amplitude of 3 V. The lowest trough also has an amplitude of 3V. Therefore, the voltages V1, V2 across both Cosine and Sine coils swings between 2V and 8V from 0 to 360 degrees. The first and second input voltages V1, V2 can be represented by the following two functions, respectively, $$V1 = V\_cosine = 5V + 3V \times \cos(\theta)$$

$$V2 = V\_sine = 5V + 3V \times \sin(\theta)$$

With reference to FIGS. 12 and 13, another driving circuit and waveform of the air-core pointer assembly are shown. This example does not require a fixed central voltage. The central voltage Vdd is thus set at 0. Both coils 53, 54 are independently and differentially with an amplitude of 3V. To generate the differential voltages, both ends of each coil 53, 54 are connected with drivers 55a, 55b and 56a, 56b. The two drivers 55a, 55b, 56a, 56b associated with each coil 53, 54 are opposite in phase. The input terminal of each pair of drivers 55a, 55b, 56a, 56b is connected to an input voltage V1, V2. Therefore, the input voltages V1, V2 generate differential voltages opposite in phase on both ends of the coils 53, 54 after passing through the drivers 55a, 55b, 56a, 56b. For example, if the input voltages V1, V2 have an amplitude of 3 V, the voltages received by the two coils 53, 54 swing between +3 V and −3 V from 0 to 360 degrees. They can be represented as:

$$V1 = V\_cosine = 3V \times \cos(\theta)$$

$$V2 = V\_sine = 3V \times \sin(\theta)$$

With reference to FIG. 14, if a calibrating magnet 57 is added next to the rotor 51, the calibrating magnet 57 interacts with the permanent magnet on the rotor 51 to force the pointer 52 back to its zero position when no voltages are imposed on the coils 53, 54. Relative to the zero position of the pointer, the calibrating magnet 57 can be disposed at any angle. However, it is generally mounted at a specific position that is easy to be controlled. For example, for single calibrating magnet, the magnet is mounted at the angle of 180 degrees. Even if the calibrating magnet 57 is added, the above-mentioned control circuit can still be used without any change.

With reference to FIG. 15, instead of using a single calibrating magnet 57, it is also possible to use two calibrating magnets 58, 59 disposed at 135 degrees and 225 degrees, respectively, to control the pointer 52. The two calibrating magnets 58, 59 achieve effectively the same effect as the single magnet 57 in FIG. 14. As vectors A and B of the calibrating magnets 58, 59 are opposite in direction, they cancel with each other. However, vectors C and D are along the same direction. They add up. Thus, the magnetic field contributed by the two calibrating magnets 58, 59 is equivalent to the single calibrating magnet 57 disposed at 180 degrees as shown in FIG. 14.

Although the external calibrating magnets 57, 58, 59 can force the pointer 52 return back to its initial position, the linearity in the rotation of the pointer 52 is sacrificed when external voltages are imposed on the coils 53, 54. In other words, the rotation angle of the pointer 52 and the strength of the imposed voltage do not keep a good linearity.

To solve the above-mentioned linearity problem, the U.S. Pat. No. 4,492,920 adds, as illustrated by FIGS. 2 and 5 in that specification, a compensating coil (labeled 41) to the original dual coil structure. When a voltage is applied to the compensating coil, a compensating magnetic field is produced. The polarities of the magnetic fields produced by the compensating magnetic field and the calibrating magnet are opposite to each other. Although this method can improve in the linearity, an additional coil is required. This not only increases the production cost but also the entire volume and weight thereof. Therefore, the approach is not ideal.

SUMMARY OF THE INVENTION

An objective of the invention is to provide a controlling method of calibrating the air-core pointer assembly and the device thereof. Without modifying the structure of the air-core pointer assembly, a compensating magnetic field is provided to improve the linearity of the rotation angle in response to an applied driving voltage.

A pointer assembly to be controlled includes a calibrating magnet, a cosine coil, a sine coil and a pointer. According to the polarity of the return-to-zero magnetic field established by the calibrating magnet, a compensating voltage is imposed on the cosine coil or the sine coil or both under either a voltage driving mode or a current driving mode. The compensating voltage establishes a compensating magnetic field to cancel the return-to-zero magnetic field. Therefore, without modifying the structure of the pointer set, the pointer has good linearity and is not affected by the calibrating magnet.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
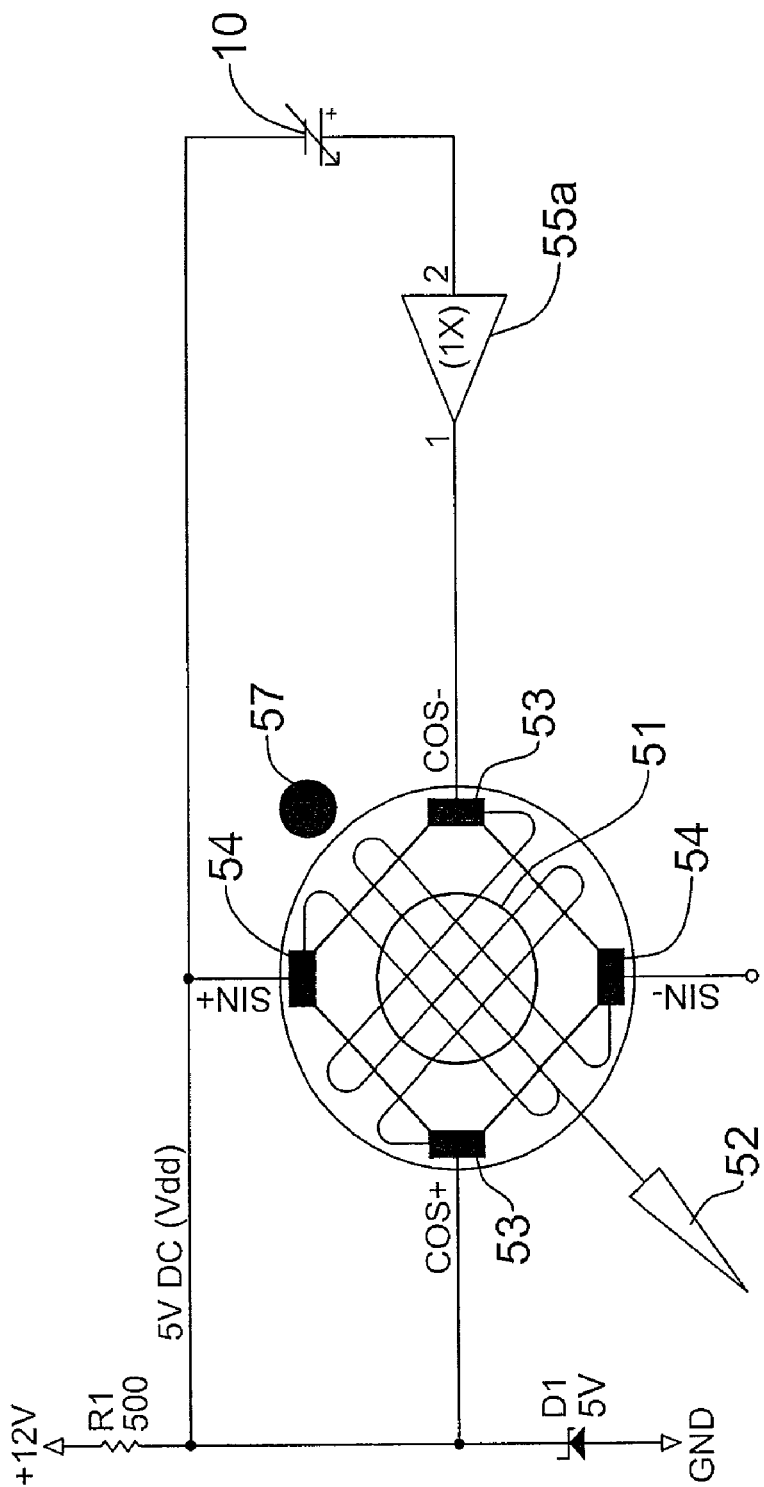
FIG. 1 is a schematic view showing how a compensating voltage for an air-core pointer assembly in accordance with the present invention is determined.

With reference to FIG. 1, the method in accordance with the present invention cancels the return-to-zero magnetic field produced by the calibrating magnet 57 using a compensating magnetic field of opposite polarities. The compensating magnetic field can be established using a compensating voltage 10. The strength of the compensating voltage 10 is determined through the following steps:

1. An adjustable DC voltage is imposed on the driver 55a of the cosine coil 53.

2. The driver 56a of the sine coil 54 is left open because the return-to-zero magnetic field does not have any effect on the orientation of the sine coil 54.

3. Rotate the pointer 52 away from its original 0-degree position. For example, rotate the pointer 52 to the 90-degree position.

4. Fine-tune the strength of the DC voltage so that the pointer 52 does not return to the 0-degree position even when the imposed force is removed.

Figure 2:
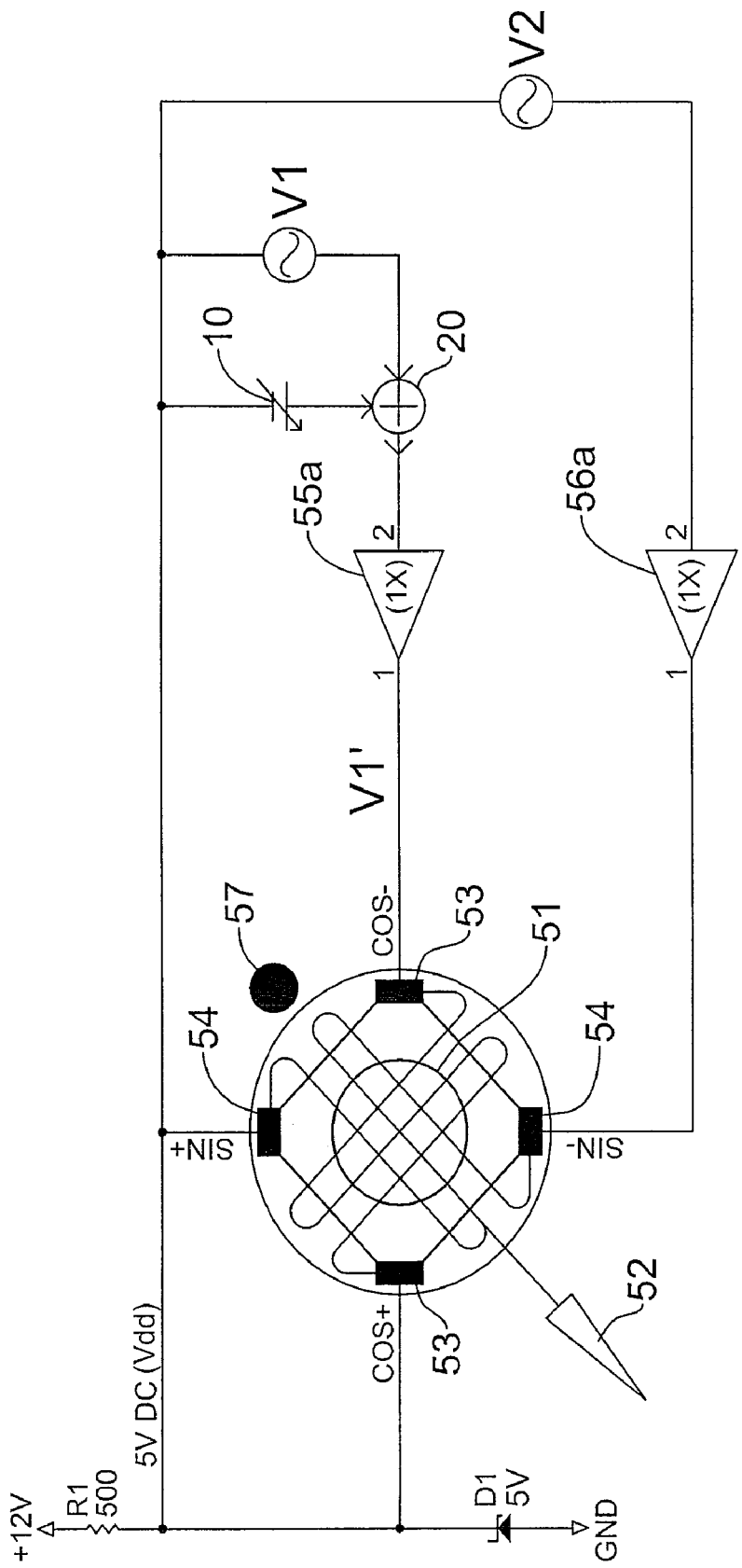
FIG. 2 is a circuit diagram of a compensating voltage being applied to the air-core pointer assembly in a first embodiment.

With reference to FIG. 2, once the compensating voltage 10 is determined, it has to be maintained and output to the driver 55a of the cosine coil 53. According to the first embodiment of the invention, the input terminal of the driver 55a is disposed with a summing circuit 20. Both input terminals of the summing circuit 20 are connected respectively to the compensating voltage 10 and the original first input voltage V1. The circuit uses a 5-volt DC voltage as a central voltage Vdd.

Figure 3:
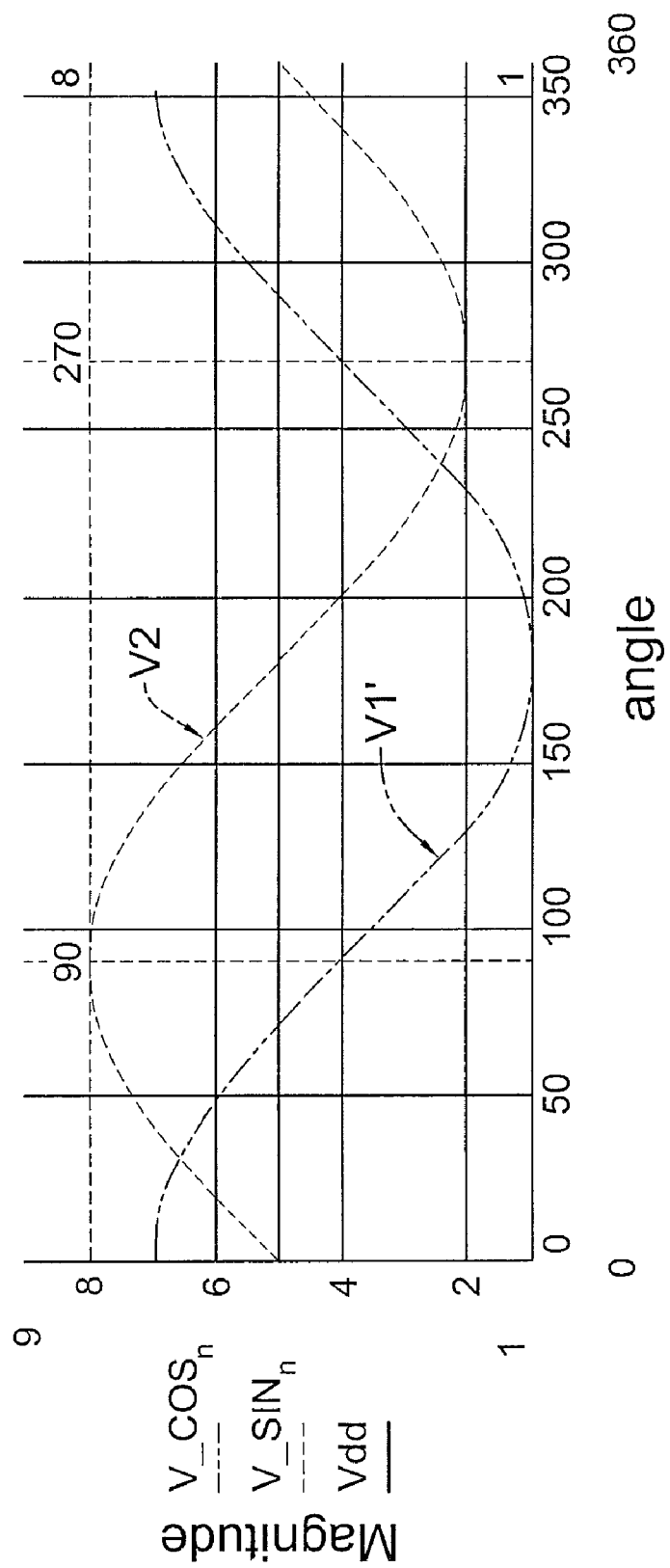
FIG. 3 shows the waveform of the compensating voltage in FIG. 2.

With reference to FIG. 3, the summing circuit 20 shifts the first input voltage V1 upwards or downwards according to the magnitude of the compensating voltage 10. For example, suppose the compensating voltage 10 is −1 V, and before compensation the first input voltage is V1=5V+3V×cos(θ) and the second input voltage is V2=5V+3V×sin(θ). After the compensating voltage 10 is imposed, the compensated first input voltage V1' falls between 1 V and 7 V. The second input voltage V2 is still kept between 2 V and 8 V.

In comparison with the situation before the compensation, it is obvious that the first input voltage V1' drops by 1 V. The compensated voltage can be expressed as:

$$V1'=5V+3V\times\cos(\theta)-1V.$$

Figure 4:
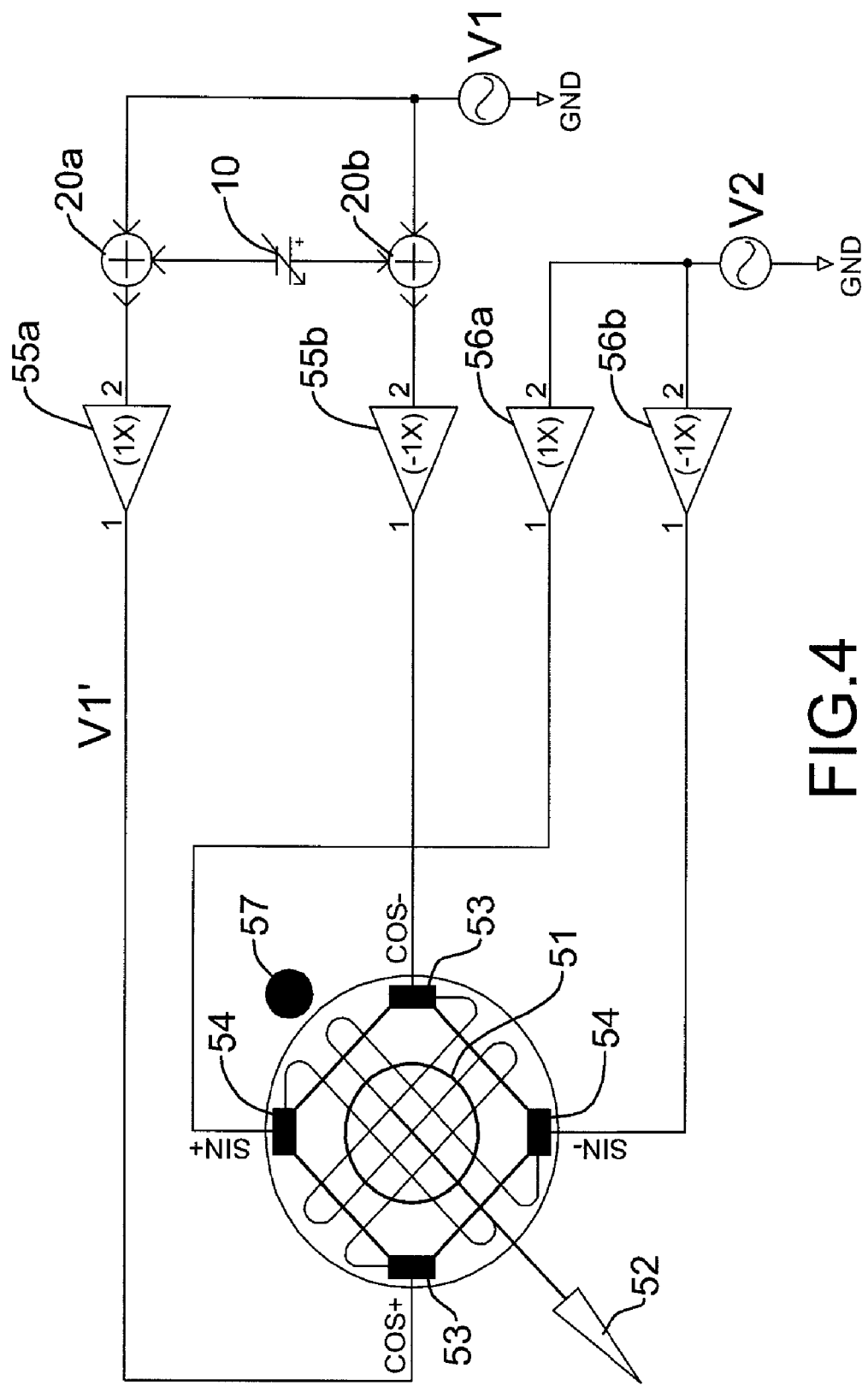
FIG. 4 is a circuit diagram of a compensating voltage being applied to the air-core pointer assembly in a second embodiment.
Figure 5:
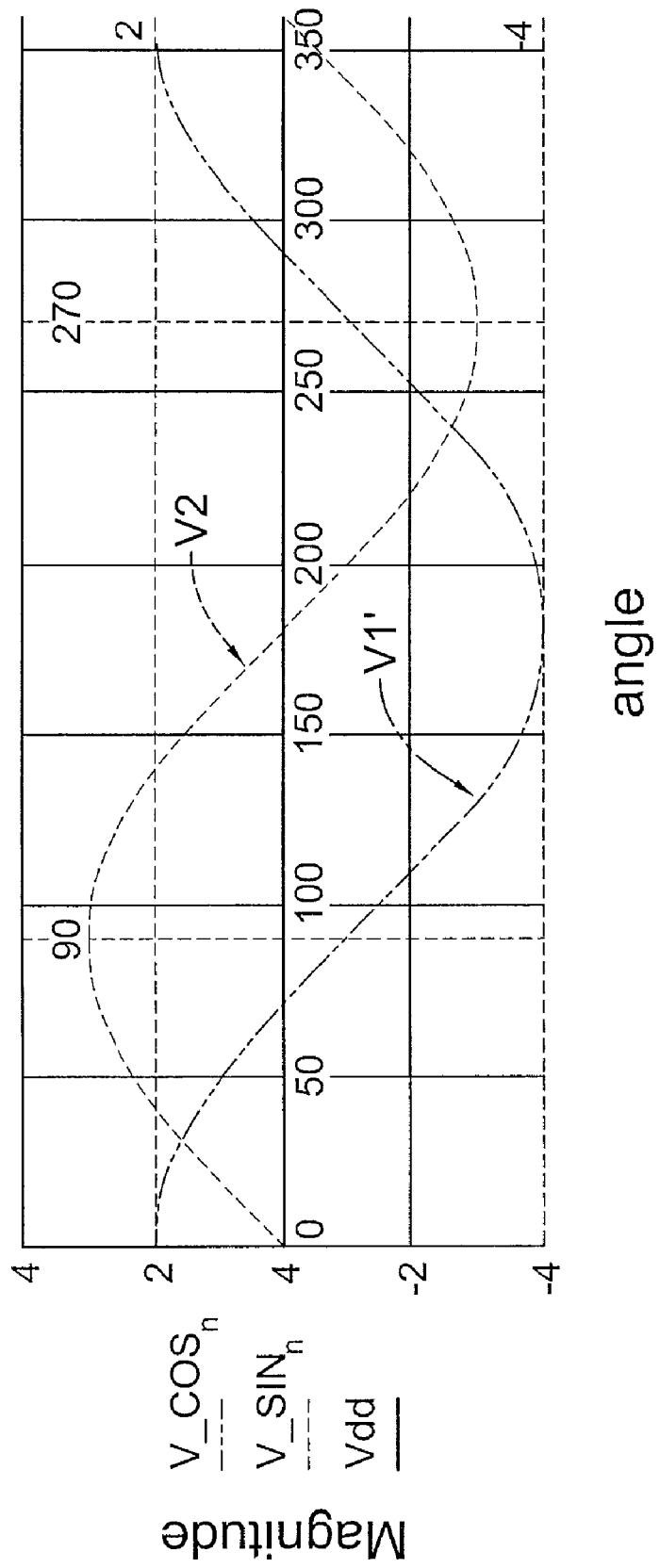
FIG. 5 shows the waveform of the compensating voltage in FIG. 4.

With reference to FIGS. 4 and 5, the invention can also be applied to differential input voltages. In this case, the central voltage Vdd is 0 V. Each input terminal of the two drivers 55a, 55b of the cosine coil 53 is disposed with a summing circuit 20a, 20b, respectively. One input terminal of the summing circuit 20a, 20b is connected to a compensating voltage 10. The other input terminal is commonly connected to the first input voltage V1. Taking a compensating voltage 10 of −1 V as an example, the compensated first input voltage V1' is still dropped by 1 V.

Figure 6:
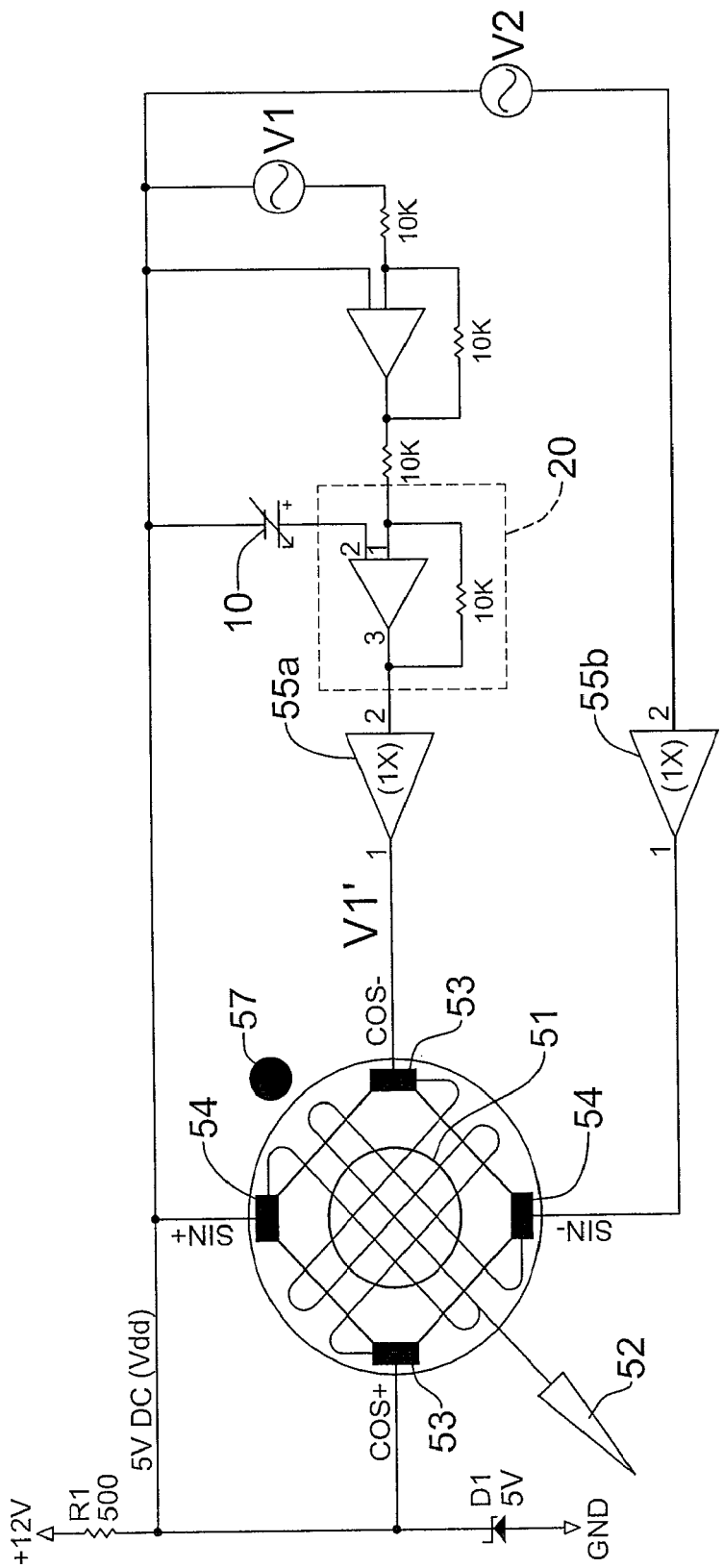
FIG. 6 is a circuit diagram of a summing circuit in accordance with the present invention.

With further reference to FIG. 6. The above-mentioned summing circuits 20, 20a, 20b can be implemented by summing operational amplifiers. The inverse input terminal thereof is connected to the output terminal. The non-inverse input terminal is connected to the compensating voltage 10.

In the above-mentioned embodiments, each compensating voltage 10 comes from an independent external voltage. If the pointer is controlled by a microprocessor via a digital-to-analog converter (DAC) or a pulse width modulator (PWM), the compensating data can be preset in the microprocessor. Thus, the control data output to the DAC or the PWM already contain the compensating data. This approach can also remove the magnetic field produced by the calibrating magnet.

According to the number and positions of the calibrating magnets 57, 58, 59, the compensating voltage 10 can be imposed on the cosine coil 53, the sine coil 54, or both of them 53, 54. For example, when the single calibrating magnet 57 is disposed at the 45-degree angle, the compensating voltage 10 is imposed on the sine coil 54. When the single calibrating magnet 57 is disposed at the 90-degree angle, the compensating voltage 10 is imposed on both the cosine coil 53 and the sine coil 54.

The cosine and sine coil drivers 55a, 55b, 56a, 56b mentioned above are operated in the voltage mode. Preferably, both drivers 55a and 55b in FIG. 2 are voltage buffers with gain equal to 1. For the differential voltage driving mode as shown in FIG. 4, the drivers 55a is a voltage buffer with gain equal to 1 while both 55b and 56b are voltage buffer with gain equal to (−1), which is an inverse voltage buffer.

Figure 7:
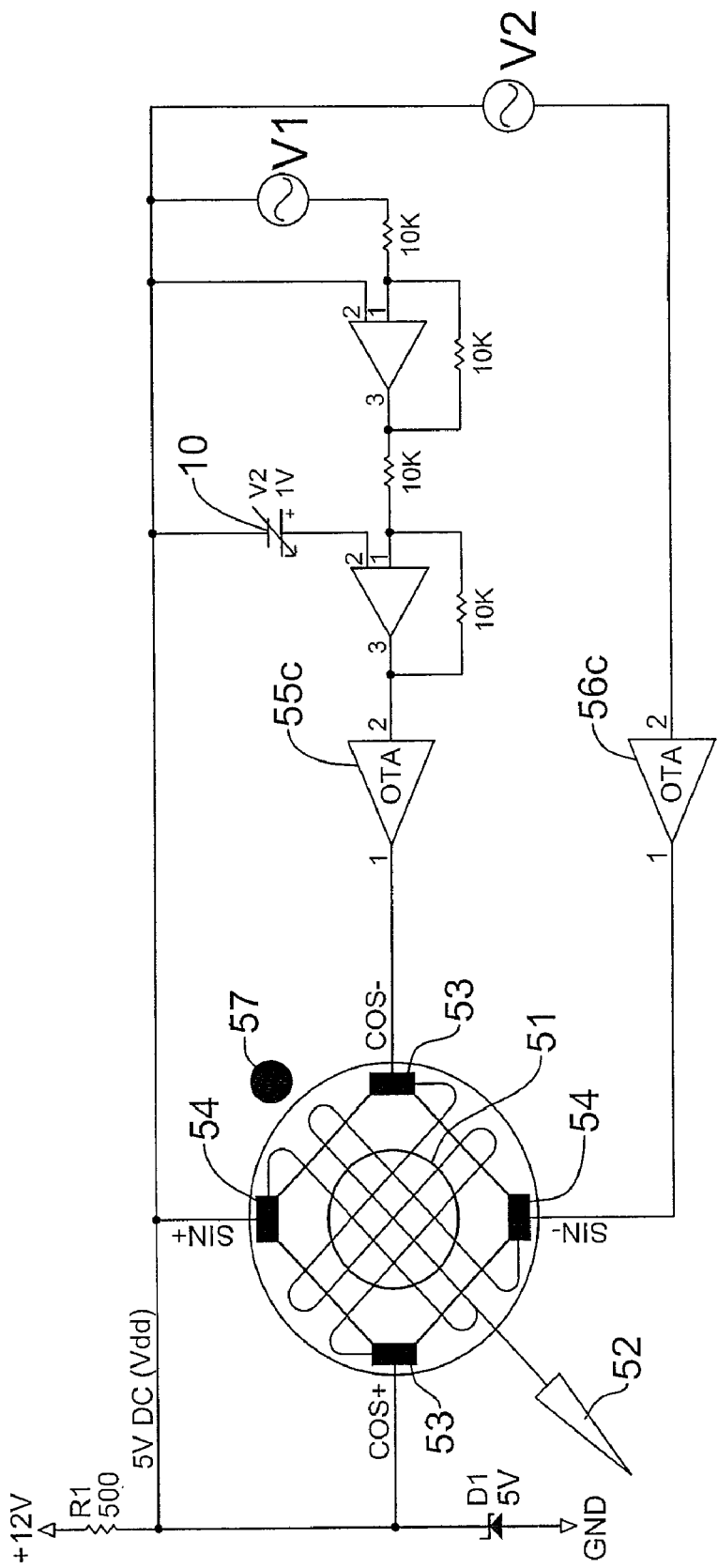
FIG. 7 is a circuit diagram of an air-core pointer assembly being operated in a current driving mode of the present invention.
Figure 8:
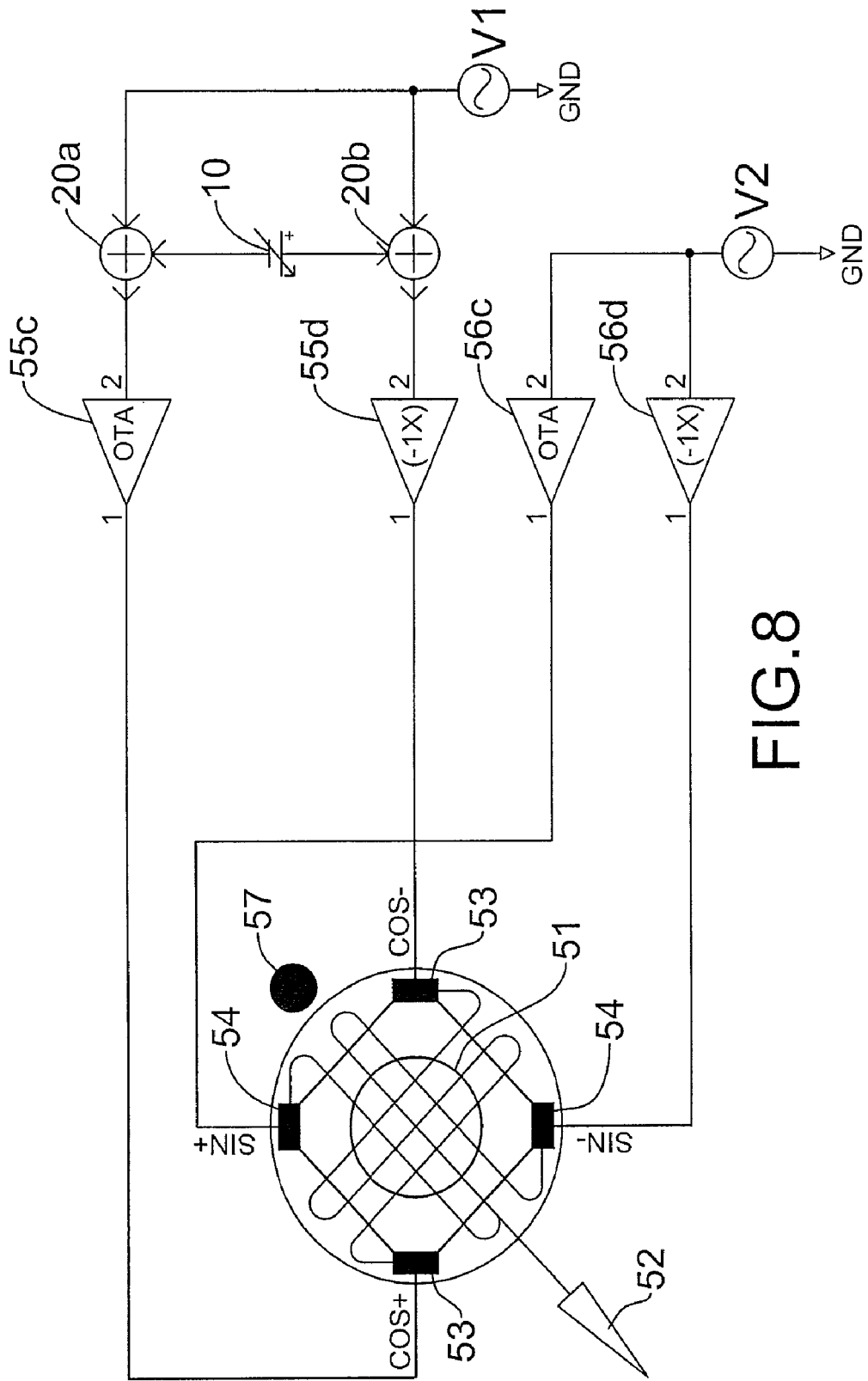
FIG. 8 is a circuit diagram of an air-core pointer assembly being operated in a current driving mode of the present invention.
Figure 9:
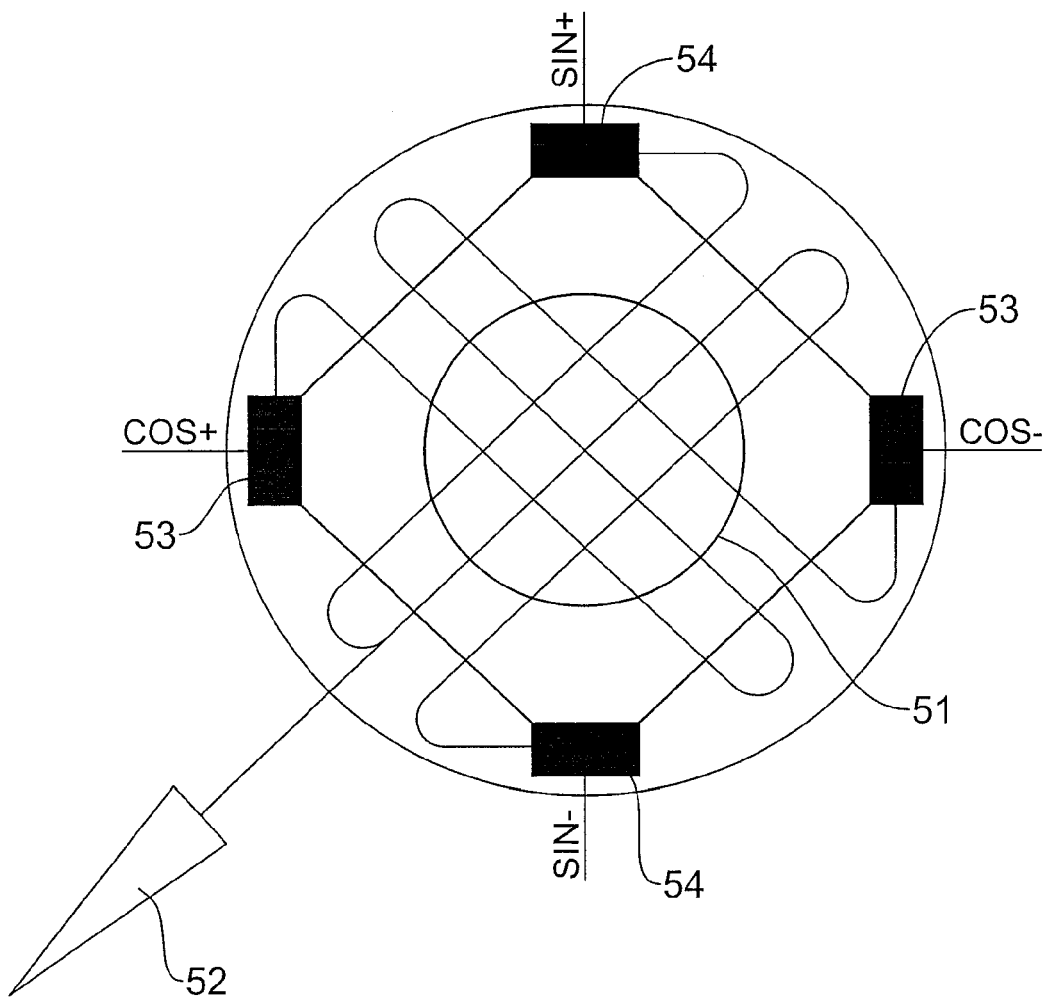
FIG. 9 is a schematic view of the structure of a conventional air-core pointer assembly.
Figure 10:
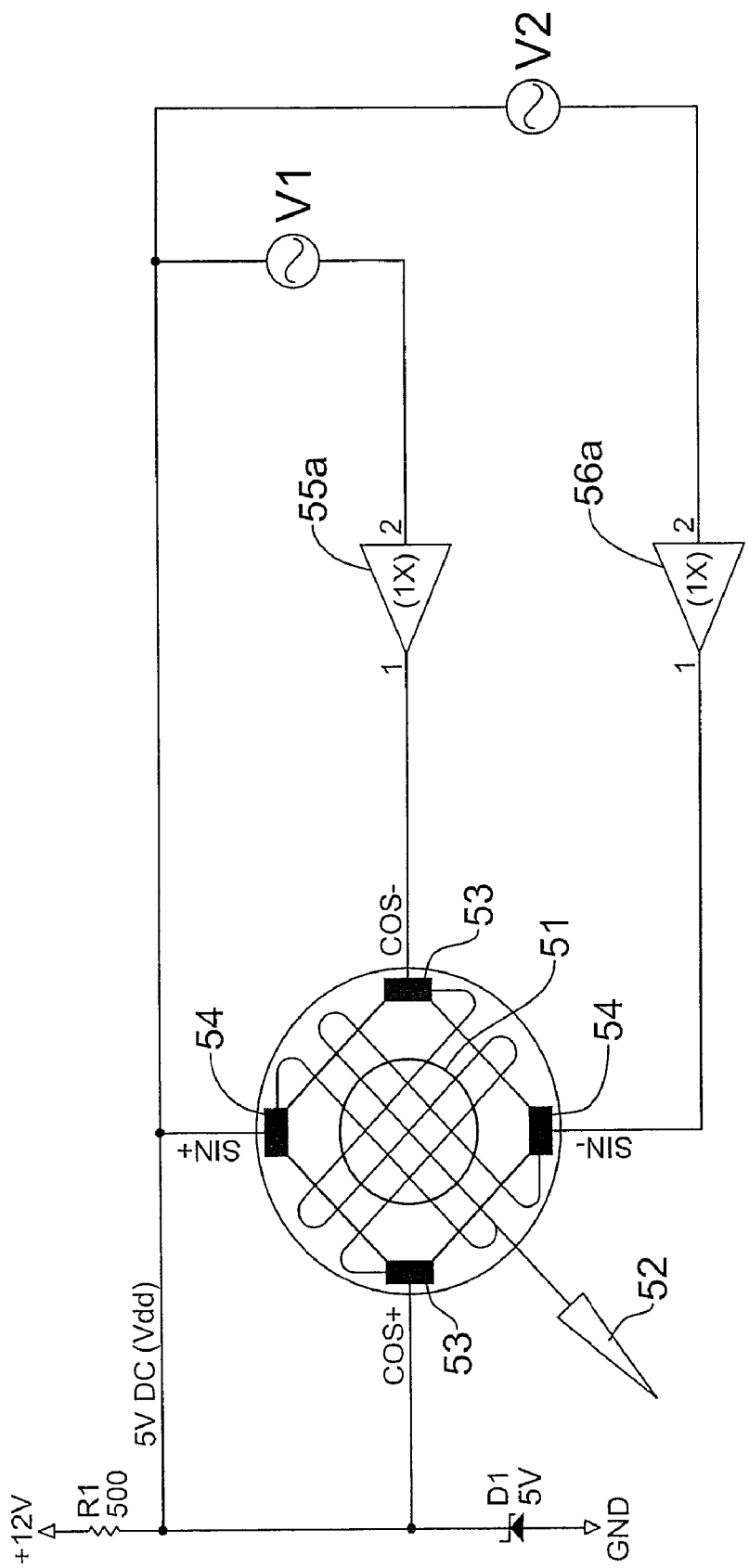
FIG. 10 is a control circuit diagram for the air-core pointer assembly.
Figure 11:
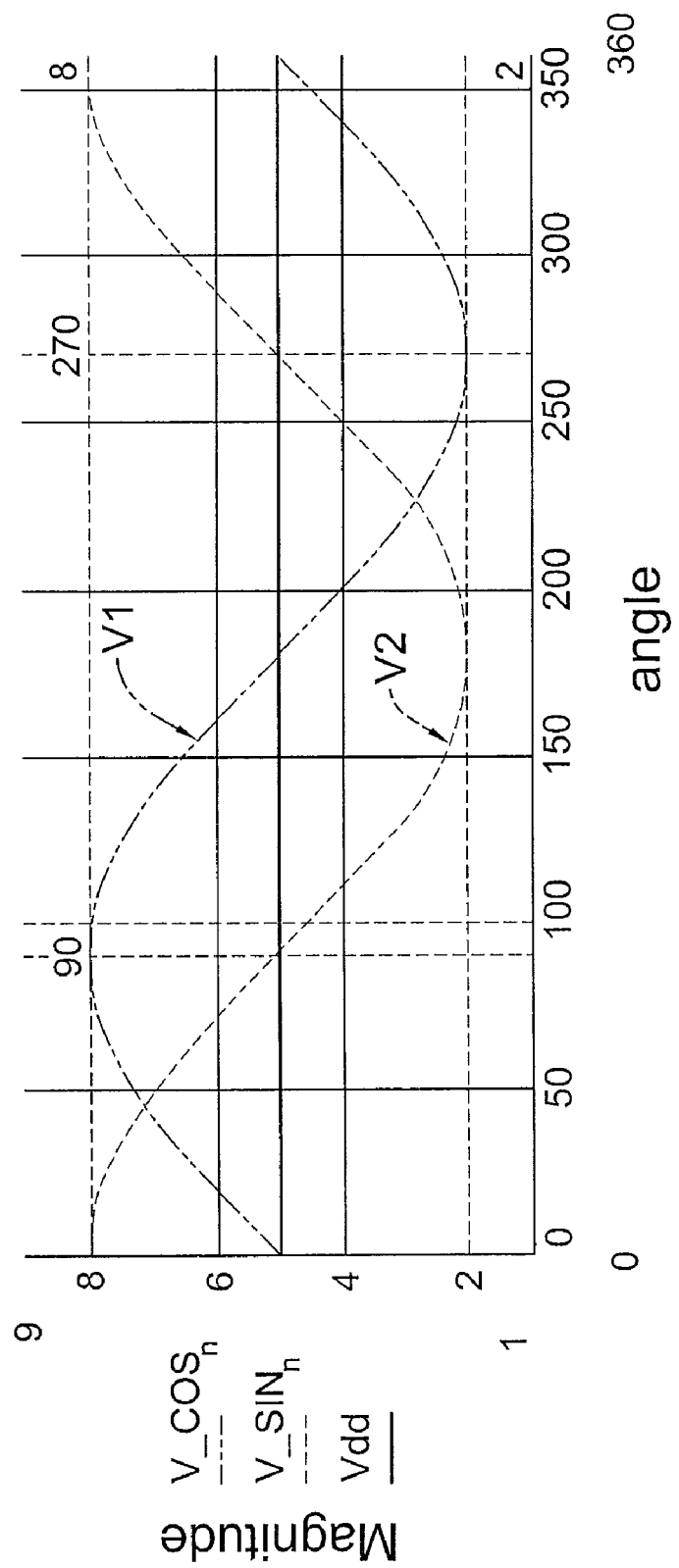
FIG. 11 shows the waveform of the control voltage for the air-core pointer assembly in FIG. 10.
Figure 12:
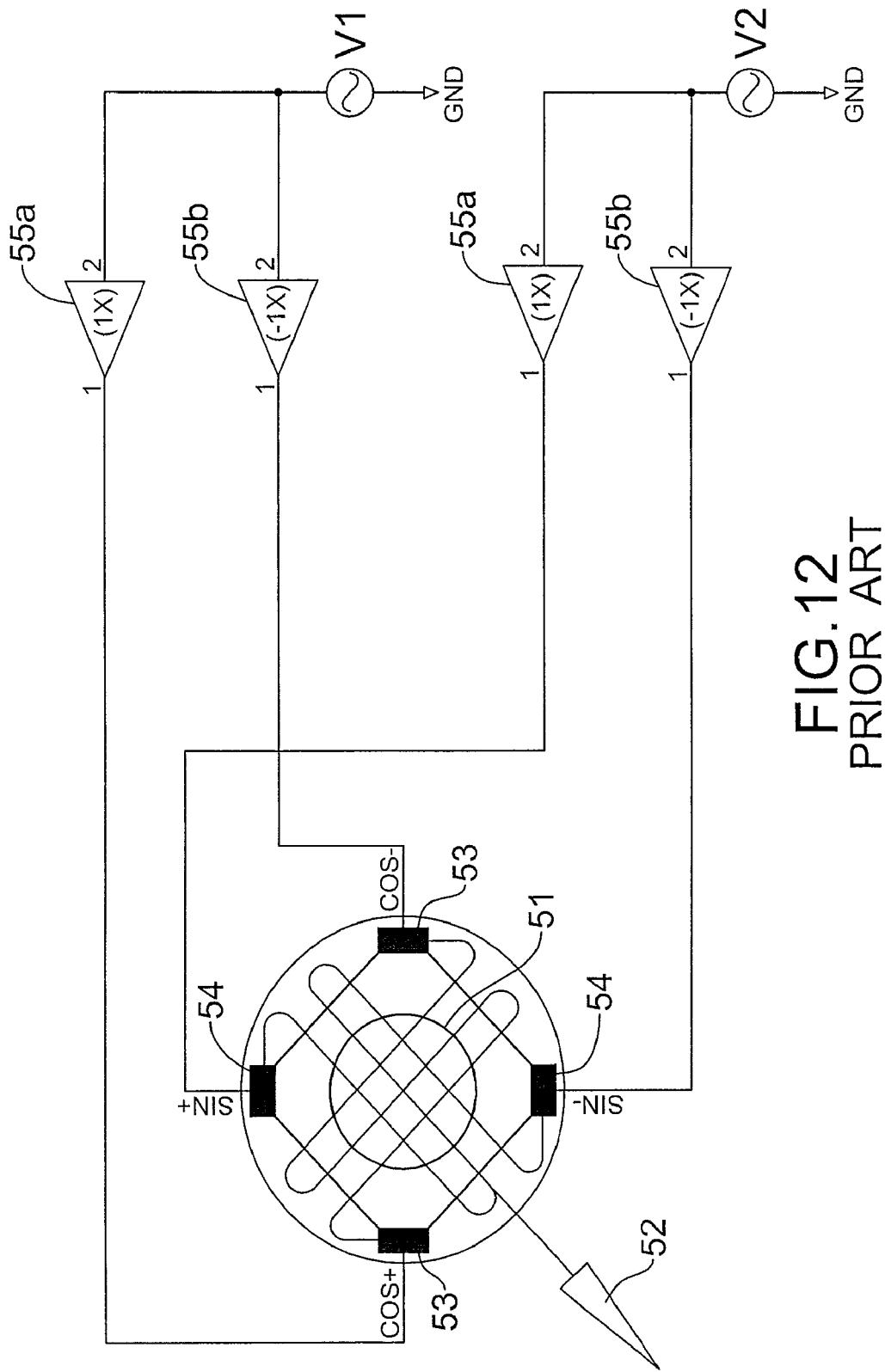
FIG. 12 is a control circuit diagram for another pointer assembly.
Figure 13:
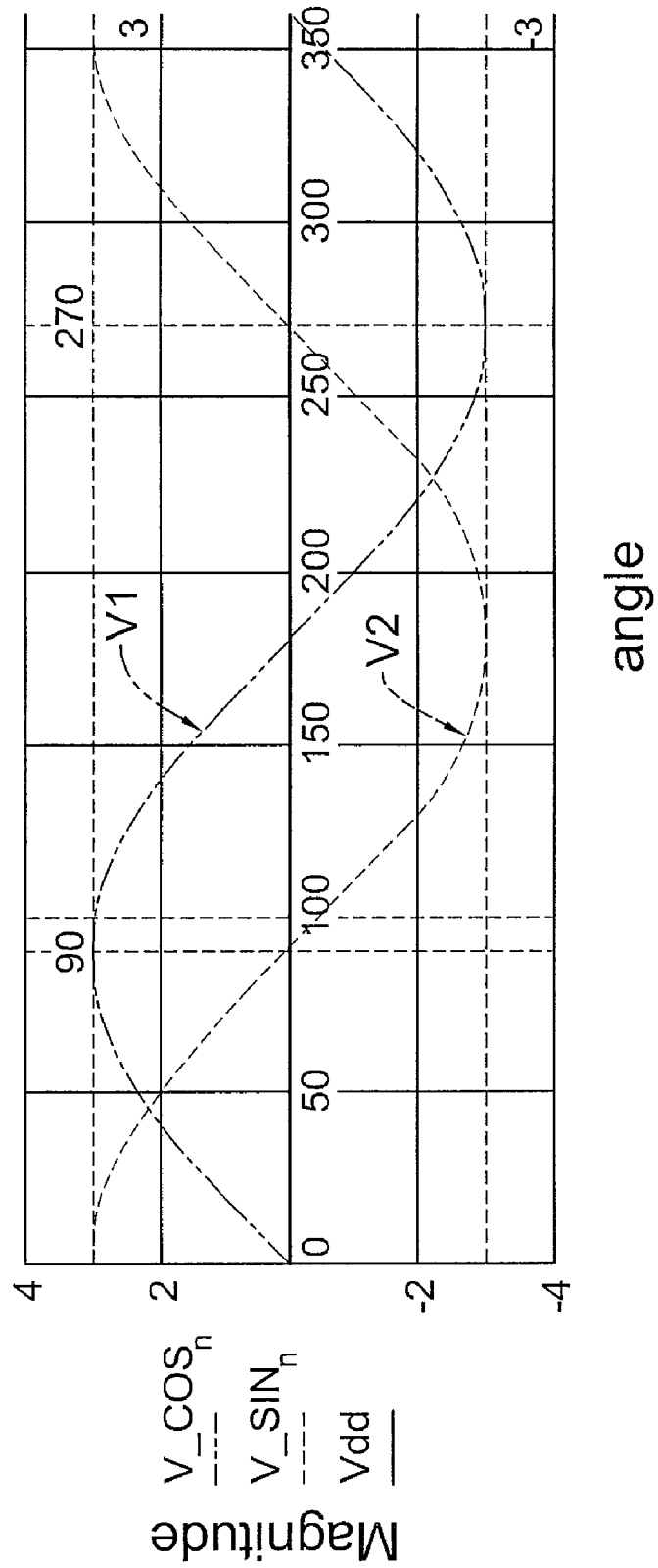
FIG. 13 shows the waveform of the control voltage for the air-core pointer assembly in FIG.
Figure 14:
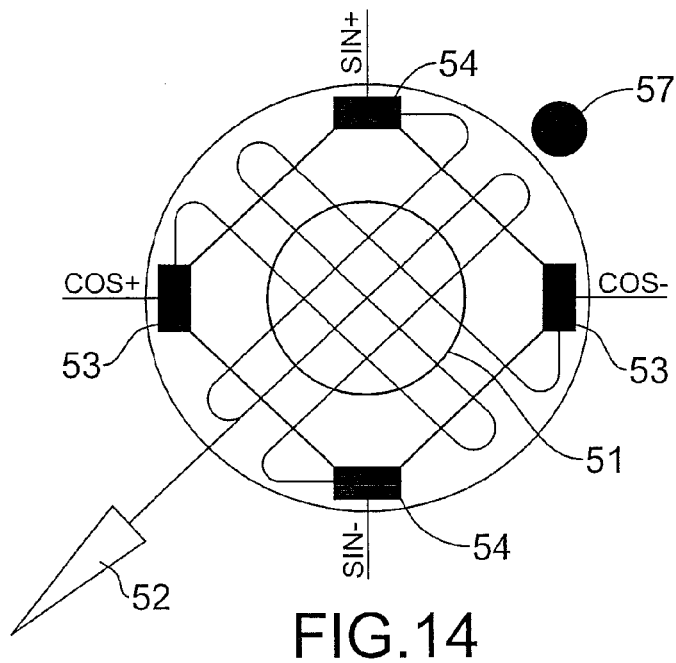
FIG. 14 shows the structure of an air-core pointer assembly with the return-to-zero function.
Figure 15:
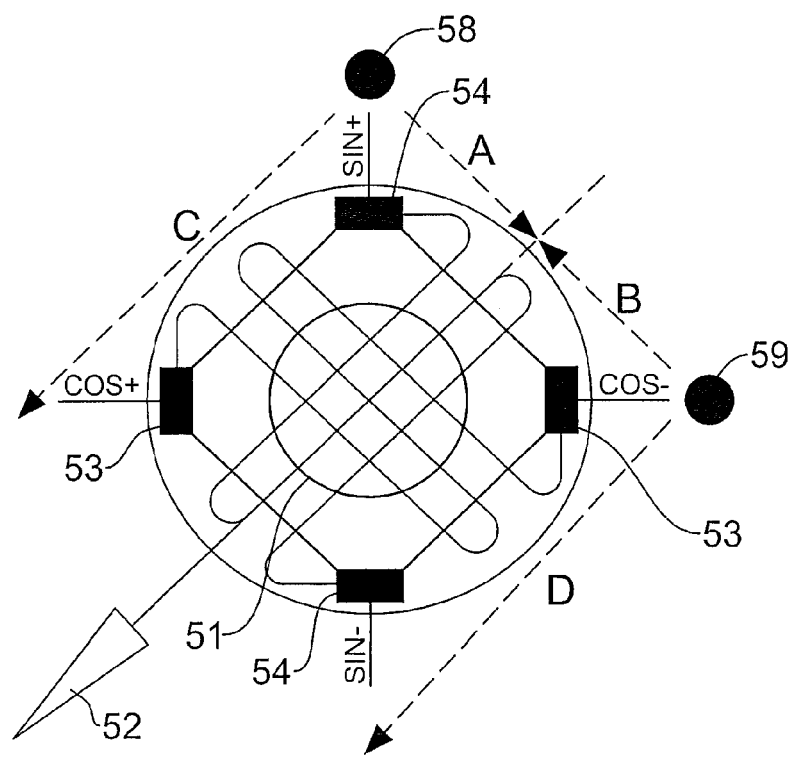
FIG. 15 shows the structure of another air-core pointer assembly with the return-to-zero function.

If the voltage mode coil driver is replaced with a voltage to current converter, which is an operational transconductance amplifier (OTA), that would turn the voltage driving mode into a current driving mode as in FIG. 7 and FIG. 8.

However, in differential current driving mode as in FIG. 8, only one OTA is needed for one coil 53, 54, and the pairing amplifiers 55d, 56d, are still voltage buffers. For example, an OTA 55c and a voltage buffer 55d are paired for the cosine coil 53, and an OTA 56c and a voltage buffer 56d are paired for the sine coil 54. There is no need to make both 55C and 55D to be OTAs. Each coil 53,54 is driven asymmetrically.

In summary, the disclosed calibration control method involves the following steps:

1. Determine the polarities of a return-to-zero magnetic field established by a calibrating magnet.

2. Determine a compensating voltage to be directly imposed on a cosine coil, a sine coil, or both of them according to the return-to-zero magnetic field.

3. Determine the magnitude of the compensating voltage so as to establish a compensating magnetic to cancel the return-to-zero magnetic field.

Without changing the original structure of the pointer, the invention directly imposes a compensating voltage on a cosine coil, a sine coil, or both of them according to the positions of the calibrating magnets. The magnetic field produced by the compensating voltage cancels with that produced by the calibrating magnets. Thereby, the pointer still keeps good linearity during its operation. When no voltage is imposed, the pointer can be correctly returned to its original position by the calibrating magnet.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A controlling device for calibrating a pointer assembly, the controlling device comprising:
   a pointer assembly having a rotor, a pointer mounted on the rotor, a cosine coil and a sine coil wound orthogonally on the rotor, and a calibrating magnet that establishes a return-to-zero magnetic field;
   a first input voltage imposed on the cosine coil;
   a second input voltage imposed on the sine coil; and
   a summing circuit adding the first input voltage with a compensating voltage, the first input voltage together with the compensating voltage being output to one end of the cosine coil so that the compensating voltage establishes a compensating magnetic field to cancel the return-to-zero magnetic field.

2. The controlling device as claimed in claim 1, wherein
   the calibrating magnet is disposed at 180 degrees with respect to a position where the pointer has not rotated yet; and
   the first input voltage together with the compensating voltage is output to the cosine coil through a voltage buffer.

3. The controlling device as claimed in claim 1, wherein
   the calibrating magnet is disposed at 180 degrees with respect to a position where the pointer has not rotated yet; and
   the first input voltage together with the compensating voltage is output to the cosine coil through an operational transconductance amplifier.

4. A controlling device for calibrating a pointer assembly, the controlling device comprising:
   a pointer assembly having a rotor, a pointer mounted on the rotor, a cosine coil and a sine coil wound orthogonally on the rotor, and a calibrating magnet that establishes a return-to-zero magnetic field;
   a first input voltage imposed on the cosine coil;
   a second input voltage imposed on the sine coil; and
   a summing circuit adding the second input voltage with a compensating voltage, the second input voltage together with the compensating voltage being output to one end of the sine coil so that the compensating voltage establishes a compensating magnetic field to cancel the return-to-zero magnetic field.

5. The controlling device as claimed in claim 4, wherein
   the calibrating magnet is disposed at 45 degrees with respect to a position where the pointer has not rotated yet; and
   the second input voltage together with the compensating voltage is output to the sine coil through a voltage buffer.

6. The controlling device as claimed in claim 4, wherein
   the calibrating magnet is disposed at 45 degrees with respect to a position where the pointer has not rotated yet; and
   the second input voltage together with the compensating voltage is output to the sine coil through an operational transconductance amplifier.

7. A controlling device for calibrating a pointer assembly, the controlling device comprising:
   a pointer assembly having a rotor, a pointer mounted on the rotor, a cosine coil and a sine coil wound orthogonally on the rotor, and a calibrating magnet that establishes a return-to-zero magnetic field;
   a first input voltage imposed on the cosine coil;
   a second input voltage imposed on the sine coil;
   a first summing circuit adding the first input voltage with a compensating voltage, the first input voltage together with the compensating voltage being output to one end of the cosine coil;
   a second summing circuit adding the second input voltage with the compensating voltage, the second input voltage together with the compensating voltage being output to one end of the sine coil; and
   the compensating voltage establishing a compensating magnetic field to cancel the return-to-zero magnetic field.

8. The controlling device as claimed in claim 7, wherein
   the calibrating magnet is disposed at 90 degrees with respect to a position where the pointer has not rotated yet;
   the first input voltage together with the compensating voltage is output to the cosine coil through a first voltage buffer; and
   the second input voltage together with the compensating voltage is output to the sine coil through a second voltage buffer.

9. The controlling device as claimed in claim 7, wherein
   the calibrating magnet is disposed at 90 degrees with respect to a position where the pointer has not rotated yet;
   the first input voltage together with the compensating voltage is output to the cosine coil through a first operational transconductance amplifier; and
   the second input voltage together with the compensating voltage is output to the sine coil through a second operational transconductance amplifier.

10. A controlling device for calibrating a pointer assembly, the controlling device comprising:
    a pointer assembly having a rotor, a pointer mounted on the rotor, a cosine coil and a sine coil wound orthogonally on the rotor, and a calibrating magnet that establishes a return-to-zero magnetic field;
    a first input voltage imposed on the cosine coil;
    a second input voltage imposed on the sine coil;
    a first summing circuit adding the first input voltage with a compensating voltage, the first input voltage together with the compensating voltage being output to a first end of the cosine coil;
    a second summing circuit adding the first input voltage with the compensating voltage, the first input voltage together with the compensating voltage being output to a second end of the cosine coil; and
    the compensating voltage establishing a compensating magnetic field to cancel the return-to-zero magnetic field.

11. The controlling device as claimed in claim 10, wherein
the calibrating magnet is disposed at 180 degrees with respect to a position where the pointer has not rotated yet;
the first input voltage together with the compensating voltage output from the first summing circuit is transmitted to the first end of the cosine coil through a first voltage buffer; and
the first input voltage together with the compensating voltage output from the second summing circuit is transmitted to the second end of the cosine coil through a second voltage buffer.

12. The controlling device as claimed in claim 10, wherein
the calibrating magnet is disposed at 180 degrees with respect to a position where the pointer has not rotated yet;
the first input voltage together with the compensating voltage output from the first summing circuit is transmitted to the first end of the cosine coil through a first operational transconductance amplifier; and
the first input voltage together with the compensating voltage output from the second summing circuit is transmitted to the second end of the cosine coil through a second operational transconductance amplifier.

13. A controlling device for calibrating a pointer assembly, the controlling device comprising:
a pointer assembly having a rotor, a pointer mounted on the rotor, a cosine coil and a sine coil wound orthogonally on the rotor, and a calibrating magnet that establishes a return-to-zero magnetic field;
a first input voltage imposed on the cosine coil;
a second input voltage imposed on the sine coil;
a first summing circuit adding the second input voltage with a compensating voltage, the second input voltage together with the compensating voltage being output to a first end of the sine coil;
a second summing circuit adding the second input voltage with the compensating voltage, the second input voltage together with the compensating voltage being output to a second end of the sine coil; and
the compensating voltage establishing a compensating magnetic field to cancel the return-to-zero magnetic field.

14. The controlling device as claimed in claim 13, wherein
the calibrating magnet is disposed at 45 degrees with respect to a position where the pointer has not rotated yet;
the second input voltage together with the compensating voltage output from the first summing circuit is transmitted to the first end of the sine coil through a first voltage buffer; and
the second input voltage together with the compensating voltage output from the second summing circuit is transmitted to the second end of the sine coil through a second voltage buffer.

15. The controlling device as claimed in claim 13, wherein
the calibrating magnet is disposed at 45 degrees with respect to a position where the pointer has not rotated yet;
the second input voltage together with the compensating voltage output from the first summing circuit is transmitted to the first end of the sine coil through a first operational transconductance amplifier; and
the second input voltage together with the compensating voltage output from the second summing circuit is transmitted to the second end of the sine coil through a second operational transconductance amplifier.

16. A controlling device for calibrating a pointer assembly, the controlling device comprising:
a pointer assembly having a rotor, a pointer mounted on the rotor, a cosine coil and a sine coil wound orthogonally on the rotor, and a calibrating magnet that establishes a return-to-zero magnetic field;
a first input voltage imposed on the cosine coil;
a second input voltage imposed on the sine coil;
a first summing circuit adding the first input voltage with a compensating voltage, the first input voltage together with the compensating voltage being output to a first end of the cosine coil;
a second summing circuit adding the first input voltage with the compensating voltage, the first input voltage together with the compensating voltage being output to a second end of the cosine coil;
a third summing circuit adding the second input voltage with the compensating voltage, the second input voltage together with the compensating voltage being output to a first end of the sine coil;
a fourth summing circuit adding the second input voltage with the compensating voltage, the second input voltage together with the compensating voltage being output to a second end of the sine coil; and
the compensating voltage establishing a compensating magnetic field to cancel the return-to-zero magnetic field.

17. The controlling device as claimed in claim 16, wherein
the calibrating magnet is disposed at 90 degrees with respect to a position where the pointer has not rotated yet;
the first input voltage together with the compensating voltage output from the first summing circuit is output to the cosine coil through a first voltage buffer;
the first input voltage together with the compensating voltage output from the second summing circuit is output to the cosine coil through a second voltage buffer;
the second input voltage together with the compensating voltage output from the third summing circuit is output to the sine coil through a third voltage buffer; and
the second input voltage together with the compensating voltage output from the fourth summing circuit is output to the sine coil through a fourth voltage buffer.

18. The controlling device as claimed in claim 16, wherein
the calibrating magnet is disposed at 90 degrees with respect to a position where the pointer has not rotated yet;
the first input voltage together with the compensating voltage output from the first summing circuit is output to the cosine coil through a first operational transconductance amplifier;
the first input voltage together with the compensating voltage output from the second summing circuit is output to the cosine coil through a first voltage buffer;
the second input voltage together with the compensating voltage output from the third summing circuit is output to the sine coil through a second operational transconductance amplifier; and
the second input voltage together with the compensating voltage output from the fourth summing circuit is output to the sine coil through a second voltage buffer.

* * * * *